(12) United States Patent
Yi et al.

(10) Patent No.: US 12,026,331 B2
(45) Date of Patent: Jul. 2, 2024

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventors: Shijuan Yi, Hubei (CN); Liang Sun, Hubei (CN); Mian Zeng, Hubei (CN); Pengfei Jiang, Hubei (CN); Likun Cheng, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 17/622,780

(22) PCT Filed: Dec. 17, 2021

(86) PCT No.: PCT/CN2021/139341
§ 371 (c)(1),
(2) Date: Dec. 24, 2021

(87) PCT Pub. No.: WO2023/103056
PCT Pub. Date: Jun. 15, 2023

(65) Prior Publication Data
US 2024/0036670 A1    Feb. 1, 2024

(30) Foreign Application Priority Data
Dec. 7, 2021 (CN) .......................... 202111483306.3

(51) Int. Cl.
*G06F 3/041*     (2006.01)
*G06V 40/13*     (2022.01)
*H10K 59/40*     (2023.01)

(52) U.S. Cl.
CPC ........ *G06F 3/0412* (2013.01); *G06V 40/1306* (2022.01); *G06V 40/1329* (2022.01); *H10K 59/40* (2023.02)

(58) Field of Classification Search
CPC .............. G06F 3/0412; G06V 40/1329; G06V 40/1306; H10K 59/40; G06K 9/0004;
(Continued)

(56) References Cited

U.S. PATENT DOCUMENTS 11,403,868 B2 * 8/2022 Yang ................... H10N 30/20
2019/0251378 A1 * 8/2019 Jung ..................... G01H 11/08
(Continued)

FOREIGN PATENT DOCUMENTS

CN       107199169 A    9/2017
CN       108899353 A    11/2018
(Continued)

OTHER PUBLICATIONS

International Search Report in International application No. PCT/CN2021/139341, mailed on Aug. 25, 2022.
(Continued)

*Primary Examiner* — Richard J Hong
(74) *Attorney, Agent, or Firm* — PV IP PC; Wei Te Chung; Zhigang Ma (57) ABSTRACT

A display panel and a mobile terminal are provided. The display panel includes a driving circuit layer, a fingerprint recognition sensor, and a light emitting device layer. The fingerprint recognition sensor is disposed on a side of the driving circuit layer, and the fingerprint recognition sensor is an ultrasonic sensor. The light emitting device layer is
(Continued)

arranged on a side of the fingerprint recognition sensor away from the driving circuit layer.

20 Claims, 6 Drawing Sheets

(58) Field of Classification Search
CPC ...... G01H 11/08; G09G 3/3208; H10N 39/00; H10N 30/20
See application file for complete search history.

(56) References Cited

U.S. PATENT DOCUMENTS

| 2020/0410196 | A1 | 12/2020 | Moon et al. | |
| 2020/0410197 | A1* | 12/2020 | Zhao | H10N 39/00 |
| 2021/0042493 | A1* | 2/2021 | Lius | G09G 3/3208 |

FOREIGN PATENT DOCUMENTS

| CN | 110112202 A | 8/2019 | |
| CN | 110265457 A | 9/2019 | |
| CN | 110865490 A | 3/2020 | |
| CN | 111048553 A | 4/2020 | |
| CN | 111584558 A | 8/2020 | |
| CN | 112420617 A | 2/2021 | |
| CN | 113013209 A | 6/2021 | |
| WO | 2017110547 A1 | 6/2017 | |
| WO | WO-2020238313 A1 * | 12/2020 | ........... G06K 9/0004 |

OTHER PUBLICATIONS

Written Opinion of the International Search Authority in International application No. PCT/CN2021/139341, mailed on Aug. 25, 2022.

Chinese Office Action issued in corresponding Chinese Patent Application No. 202111483306.3 dated May 8, 2023, pp. 1-10.

* cited by examiner

DISPLAY PANEL AND MOBILE TERMINAL

FIELD OF INVENTION

The present application relates to the field of display technologies, and more particularly to a display panel and a mobile terminal.

BACKGROUND OF INVENTION

With popularity of a full-screen concept of mobile phones, mainstream mobile phones in the market have begun to adopt a fingerprint recognition technology under the screen. The fingerprint recognition technology under the screen is a new technology that completes the fingerprint recognition and unlocking process through a bottom of a screen glass. This mainly uses optical, ultrasonic, and other penetration principles to achieve the purpose of fingerprint recognition.

Ultrasonic solution scans a finger using ultrasonic waves of a specific frequency emitted by a fingerprint module. Ultrasonic waves are absorbed, penetrated, and reflected differently when they reach a surface of different materials. Therefore, the difference in acoustic impedance between skin and air or different skin layers can be used to identify a location of fingerprint ridges and valleys. Ultrasonic fingerprint recognition has the following advantages: it is more penetrating, can perform deep subcutaneous fingerprint recognition and can distinguish living bodies. Therefore, a security of a program is higher. It is not easy to be interfered by oil stains, water stains and strong light.

A currently known ultrasonic fingerprint recognition integration solution is to stick an ultrasonic fingerprint module outside an organic light emitting diode (OLED) screen. This increases the cost, increases a thickness of the screen, and reduces a comfort of use.

Technical Problem

Embodiments of the present application provide a display panel and a mobile terminal, which can solve the technical problems of high thickness, high cost, and low use comfort of an organic light emitting diode screen.

SUMMARY OF INVENTION

An embodiment of the present application provides a display panel, comprising:
  a driving circuit layer comprising a first driving circuit and a second driving circuit;
  a fingerprint recognition sensor disposed on a side of the driving circuit layer, wherein the fingerprint recognition sensor is electrically connected to the first driving circuit, the fingerprint recognition sensor comprises a piezoelectric layer, a plurality of first electrodes disposed on a side of the piezoelectric layer, and a second electrode disposed on another side of the piezoelectric layer, the first electrodes are electrically connected to the first driving circuit, and the first electrodes are disposed at intervals;
  a protective layer disposed on a side of the fingerprint recognition sensor away from the driving circuit layer, wherein the protective layer is provided with a first contact hole, the first contact hole is located between two adjacent first electrodes, and the first contact hole penetrates the piezoelectric layer and the second electrode; and
  a light emitting device layer disposed on a side of the fingerprint recognition sensor away from the driving circuit layer, and the light emitting device layer is electrically connected to the second driving circuit through the first contact hole.

Optionally, in some embodiments of the present application, the piezoelectric layer is provided with a first escape opening for avoiding the first contact hole, the second electrode is provided with a second escape opening for avoiding the first contact hole, and the protective layer covers inner walls of the first escape opening and the second escape opening.

Optionally, in some embodiments of the present application, the first electrode is disposed on a side of the piezoelectric layer close to the driving circuit layer.

Optionally, in some embodiments of the present application, the second electrode is disposed on a side of the piezoelectric layer close to the driving circuit layer.

Optionally, in some embodiments of the present application, the fingerprint recognition sensor further comprises an interlayer dielectric layer disposed between the first electrode and the piezoelectric layer, and the first contact hole penetrates the interlayer dielectric layer.

Optionally, in some embodiments of the present application, the first driving circuit comprises a first thin film transistor electrically connected to the first electrode.

Optionally, in some embodiments of the present application, the second driving circuit comprises a second thin film transistor electrically connected to the light emitting device layer, and the light emitting device layer is electrically connected to the second thin film transistor through the first contact hole.

Optionally, in some embodiments of the present application, the first thin film transistor comprises a first semiconductor layer, a first source in contact with an end of the first semiconductor layer, a first drain in contact with another end of the first semiconductor layer, and a first gate spaced on a side of the first semiconductor layer, and the first electrode is connected to the first drain;
  the second thin film transistor comprises a second semiconductor layer, a second source in contact with an end of the second semiconductor layer, a second drain in contact with another end of the second semiconductor layer, and a second gate spaced on a side of the second semiconductor layer, and the second drain is electrically connected to the light emitting device layer;
  wherein the first semiconductor layer and the second semiconductor layer are arranged in a same layer, the first source, the first drain, the second source and the second drain are arranged in a same layer, and the first gate and the second gate are arranged in a same layer.

Optionally, in some embodiments of the present application, the driving circuit layer further comprises a substrate, a buffer layer, a first insulating layer, a second insulating layer, and a planarization layer, the first semiconductor layer and the second semiconductor layer are disposed on the buffer layer at intervals, the first insulating layer covers the first semiconductor layer, the second semiconductor layer, and the buffer layer; the first gate and the second gate are arranged on the first insulating layer at intervals, the first gate is located above the first semiconductor layer, the second gate is located above the second semiconductor layer; the second insulating layer covers the first gate, the second gate, and the first insulating layer; the first source, the first drain, the second source, and the second drain are spaced apart on the second insulating layer, the first source and the first drain are located above the first semiconductor layer, the second source and the second drain are located above the second semiconductor layer; the planarization layer covers the first source, the first drain, the second source, and the second drain.

Optionally, in some embodiments of the present application, the driving circuit layer further comprises a third electrode, a fourth electrode, and an interlayer insulating layer, the third electrode and the fourth electrode are disposed between the second insulating layer and the planarization layer, the third electrode and the fourth electrode are spaced apart, the third electrode is located above the first gate, the third electrode and the first gate form a first storage capacitor; the fourth electrode is located above the second gate, the fourth electrode and the second gate form a second storage capacitor; the interlayer insulating layer covers the third electrode, the fourth electrode, and the second insulating layer; the first source, the first drain, the second source, and the second drain are arranged on the interlayer insulating layer at intervals; the planarization layer covers the first source, the first drain, the second source, the second drain, and the interlayer insulating layer.

Optionally, in some embodiments of the present application, the interlayer dielectric layer is provided with a second contact hole, the second contact hole is provided corresponding to the first contact hole, and the light emitting device layer is connected to the second drain through the first contact hole and the second contact hole.

Optionally, in some embodiments of the present application, the planarization layer is provided with a third contact hole for exposing the second drain, the third contact hole is provided corresponding to the first contact hole and the second contact hole, and the light emitting device layer is connected to the second drain through the first contact hole, the second contact hole, and the third contact hole.

Optionally, in some embodiments of the present application, the planarization layer is provided with a fourth contact hole for exposing the first drain, and the first electrode is connected to the first drain through the fourth contact hole.

Optionally, in some embodiments of the present application, the interlayer dielectric layer is provided with a fifth contact hole corresponding to the fourth contact hole, the fifth contact hole penetrates the piezoelectric layer and the second electrode, and the first electrode is connected to the first drain through the fourth contact hole and the fifth contact hole.

Optionally, in some embodiments of the present application, the piezoelectric layer is provided with a third escape opening for avoiding the fifth contact hole, the second electrode is provided with a fourth escape opening for avoiding the fifth contact hole, and the interlayer dielectric layer covers inner walls of the third escape opening, the fourth escape opening, and the fourth contact hole.

Optionally, in some embodiments of the present application, the light emitting device layer comprises a fifth electrode, an organic light emitting layer disposed on the fifth electrode, and a sixth electrode disposed on the organic light emitting layer, the fifth electrode is connected to the second drain, and the fifth electrode is disposed on the protective layer.

Optionally, in some embodiments of the present application, the light emitting device layer further comprises a pixel definition layer, the pixel definition layer covers the fifth electrode and the protective layer, the pixel definition layer encloses a plurality of openings, the openings expose the fifth electrode, the organic light emitting layer is disposed in the openings, and the sixth electrode covers the organic light emitting layer in the openings.

Optionally, in some embodiments of the present application, the light emitting device layer further comprises an encapsulation layer, and the encapsulation layer covers the pixel definition layer and the sixth electrode.

Optionally, in some embodiments of the present application, the display panel further comprises a touch layer disposed on a side of the light emitting device layer away from the fingerprint recognition sensor.

An embodiment of the present application also provides a mobile terminal, comprising:
  the above display panel;
  an integrated circuit chip electrically connected to the display panel; and
  a flexible circuit board, wherein an end of the flexible circuit board is electrically connected to the display panel.

Beneficial Effect

The embodiments of the application adopt a display panel and a mobile terminal. By integrating the fingerprint recognition sensor inside the display panel, that is, the fingerprint recognition sensor is formed in the process of manufacturing the display panel, which can save costs and reduce a thickness of the display panel. This makes the mobile terminal adopting the display panel of the embodiments of the present application lighter and thinner, which is convenient for the user to hold and operate, and greatly improves a comfort of use.

DESCRIPTION OF DRAWINGS

In order to explain the embodiments or the technical solutions in the prior art more clearly, the following will briefly introduce the drawings that need to be used in the description of the embodiments or the prior art. Obviously, the drawings in the following description are only some embodiments of the invention. For those of ordinary skill in the art, other drawings can be obtained based on these drawings without creative work.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. In addition, it should be understood that the specific implementations described here are only used to illustrate and explain the application and are not used to limit the application. In this application, if no explanation is made to the contrary, the orientation words used such as "upper" and "lower" generally refer to the upper and lower directions of the device in actual use or working state, and specifically refer to the drawing directions in the drawings. "Inner" and "outer" refer to the outline of the device.

The embodiments of the present application provide a display panel and a mobile terminal. Detailed descriptions are given below. It should be noted that the order of description in the following embodiments is not meant to limit the preferred order of the embodiments.

Figure 1:
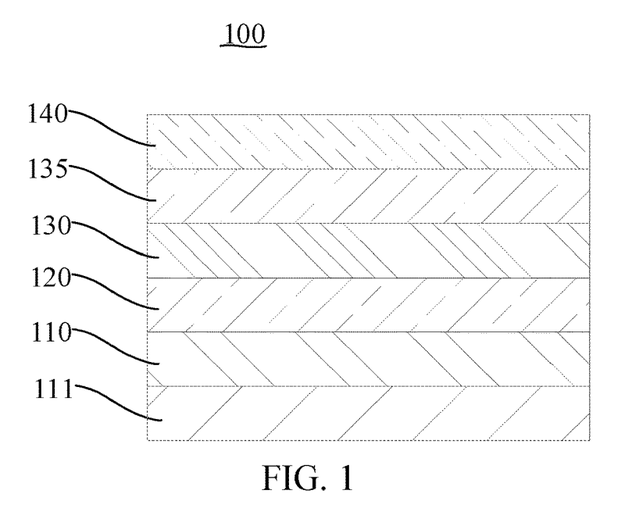
FIG. 1 is a schematic structural diagram of a display panel provided by an embodiment of the present application.
Figure 2:
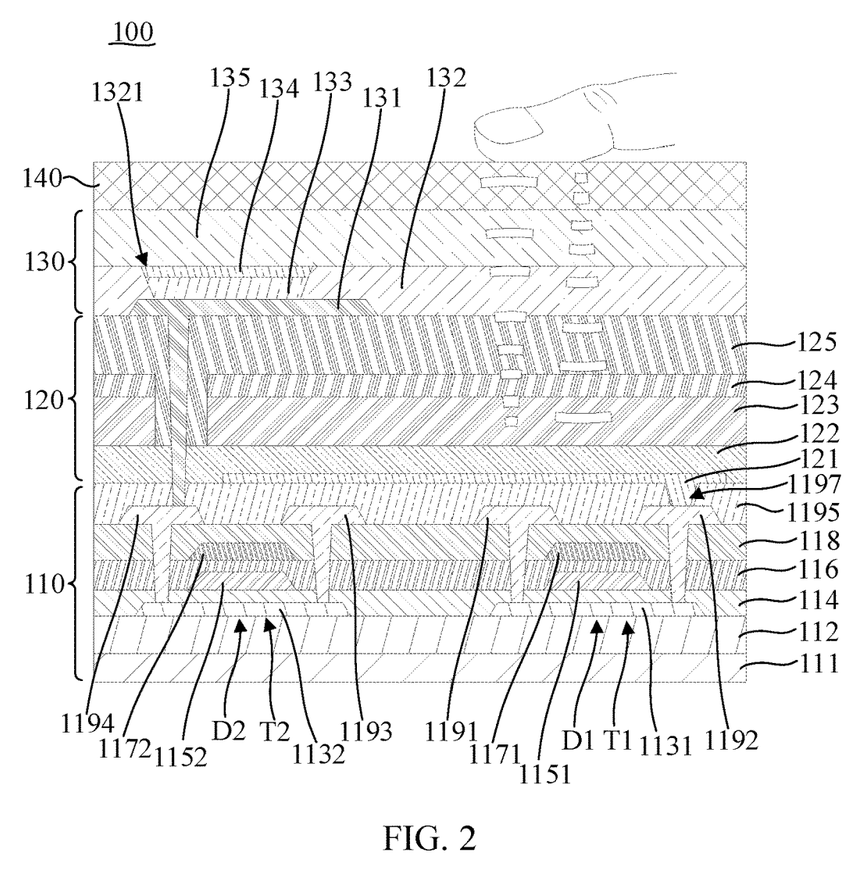
FIG. 2 is a schematic cross-sectional structure diagram of a first display panel provided by an embodiment of the present application.
Figure 3:
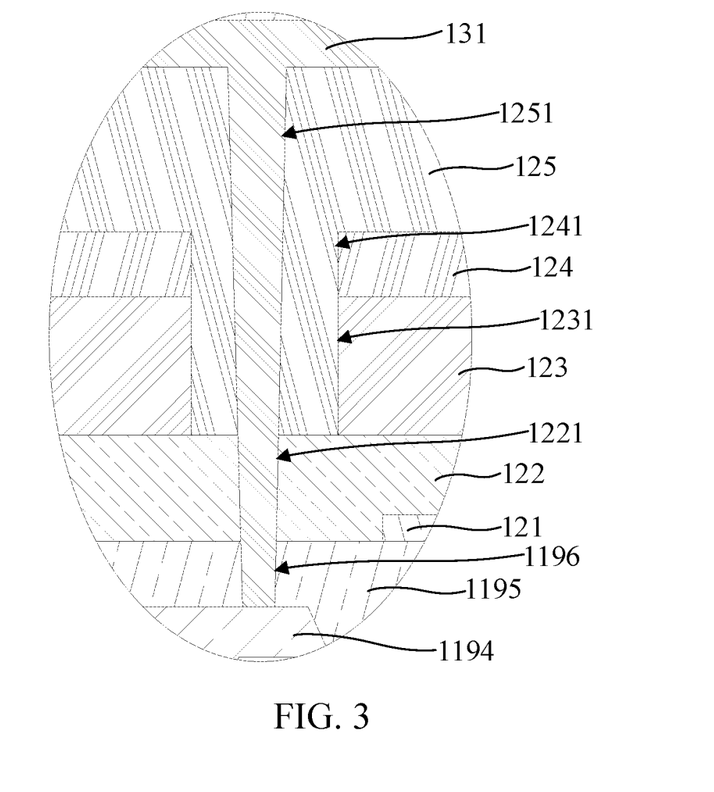
FIG. 3 is a schematic partial enlarged cross-sectional structure diagram of a first display panel provided by an embodiment of the present application.

Referring to FIG. 1 to FIG. 3, an embodiment of the present application provides a display panel 100 including a driving circuit layer 110, a fingerprint recognition sensor 120, and a light emitting device layer 130. The fingerprint recognition sensor 120 is arranged on one side of the driving circuit layer 110. The fingerprint recognition sensor 120 is electrically connected to the driving circuit layer 110. The fingerprint recognition sensor 120 is an ultrasonic sensor. The fingerprint recognition sensor 120 is used to send and receive ultrasonic waves, and convert the received ultrasonic waves into electrical signals for output. The light emitting device layer 130 is provided on a side of the fingerprint recognition sensor 120 away from the driving circuit layer 110. The light emitting device layer 130 is electrically connected to the driving circuit layer 110.

The working principle of the embodiments of the present application is that fingers have ridges and valleys. The ridges and valleys constitute a fingerprint of a finger. The fingerprint recognition sensor 120 emits ultrasonic waves. When the finger touches the display panel 100, the ultrasonic waves at an interface between the finger and the display panel 100 will be reflected by the ridges and valleys of the finger. After receiving the ultrasonic waves reflected by the ridges and the ultrasonic waves reflected by the valleys, the fingerprint recognition sensor 120 converts the ultrasonic waves reflected by the ridges and the ultrasonic waves reflected by the valleys into electrical signals. Since phases of the ultrasonic waves reflected by the ridges and the ultrasonic waves reflected by the valleys are different, the fingerprint identification sensor 120 can obtain the electric signals corresponding to the ridges and the electric signals corresponding to the valleys. The fingerprint recognition sensor 120 outputs the above-mentioned electrical signal to the driving circuit layer 110. The electrical signal is processed by the driving circuit layer 110 to realize fingerprint recognition. In this embodiment, the driving circuit layer 110 includes a first driving circuit D1 for driving the fingerprint recognition sensor 120 and a second driving circuit D2 for driving the light emitting device layer 130. The first driving circuit D1 is electrically connected to the fingerprint recognition sensor 120, and the second driving circuit D2 is electrically connected to the light emitting device layer 130.

The beneficial effect of the display panel 100 of the embodiment of the present application lies in that the fingerprint identification sensor 120 is integrated into the display panel 100. That is, the fingerprint recognition sensor 120 is formed in the process of manufacturing the display panel 100, which can save the cost of attaching materials and labor. In addition, since film layers such as adhesive glue are saved, the thickness of the display panel 100 can be reduced. This makes the mobile terminal (such as a mobile phone, a tablet computer, etc.) using the display panel 100 of the embodiment of the present application lighter and thinner, which is convenient for users to hold and operate, and greatly improves the comfort of use.

Specifically, as shown in FIG. 2, the fingerprint recognition sensor 120 includes a piezoelectric layer 123, a plurality of first electrodes 121 provided on one side of the piezoelectric layer 123, and a second electrode 124 provided on the other side of the piezoelectric layer 123. The first electrode 121 is electrically connected to the first driving circuit D1, and a plurality of first electrodes 121 are arranged at intervals.

By connecting an appropriate potential to the first electrode 121 and the second electrode 124, there is a voltage difference between the first electrode 121 and the second electrode 124. The voltage difference between the two opposite sides of the piezoelectric layer 123 will drive the piezoelectric layer 123 to deform (vibrate) and generate ultrasonic waves. That is, the piezoelectric layer 123 converts electrical energy into mechanical energy, and the piezoelectric layer 123 generates and emits ultrasonic waves through vibration. The ultrasonic waves at the interface between the finger and the display panel 100 will be reflected by the ridges and valleys of the finger to the first electrode 121. Because the phases of the ultrasonic waves reflected by the ridges and the ultrasonic waves reflected by the valleys are different, the first electrode 121 induces the induced charges corresponding to the ridges and the induced charges corresponding to the valleys. The number of induced charges corresponding to the ridge is different from the number of induced charges corresponding to the valley, so that the electrical signal corresponding to the ridge and the electrical signal corresponding to the valley are obtained. The first electrode 121 transmits the above-mentioned electrical signal to the driving circuit layer 110.

Figure 4:
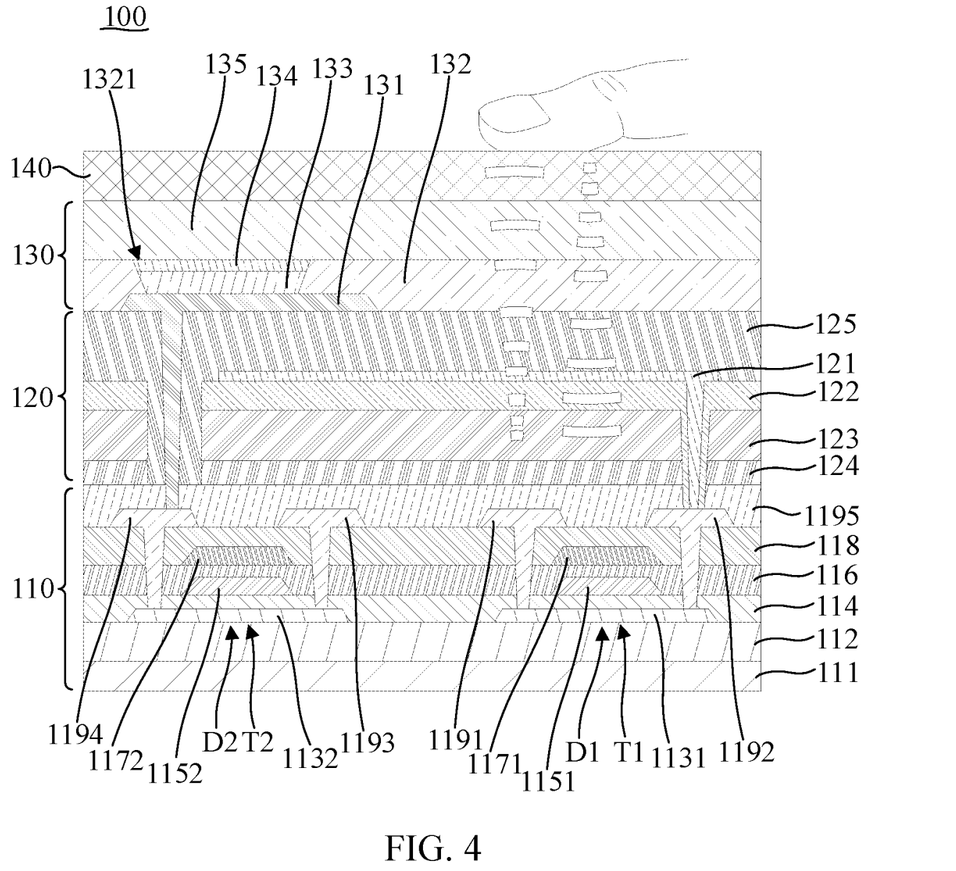
FIG. 4 is a schematic cross-sectional structure diagram of a second display panel provided by an embodiment of the present application.
Figure 5:
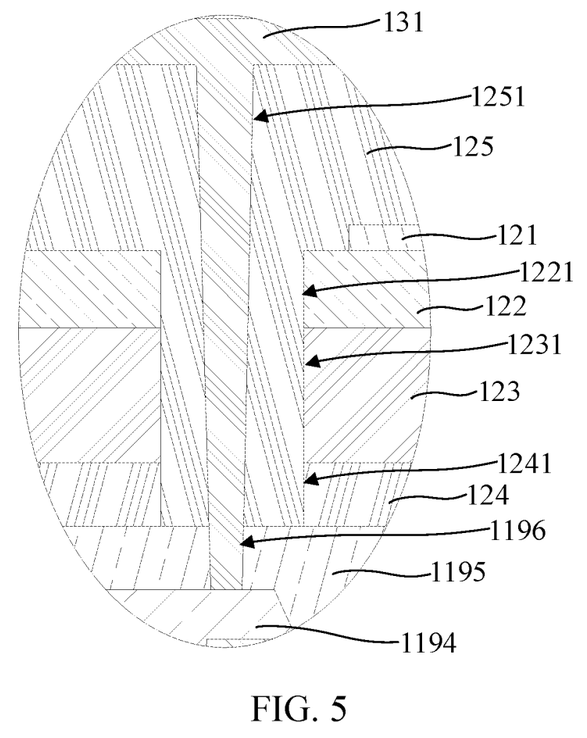
FIG. 5 is a schematic diagram 1 of a partial enlarged cross-sectional view of a second type of display panel provided by an embodiment of the present application.

Specifically, as shown in FIG. 2, in this embodiment, the first electrode 121 is provided on the side of the piezoelectric layer 123 close to the driving circuit layer 110. It can be understood that the stacking sequence of the first electrode 121, the piezoelectric layer 123, and the second electrode 124 can be adjusted according to actual selection and specific requirements. As shown in FIG. 4, the second electrode 124 is provided on the side of the piezoelectric layer 123 close to the driving circuit layer 110, which can also realize the function of fingerprint recognition.

Specifically, as shown in FIG. 2 and FIG. 4, the display panel 100 further includes a protective layer 125 disposed on the fingerprint recognition sensor 120 away from the driving circuit layer 110. That is, the protective layer 125 is provided between the fingerprint recognition sensor 120 and the light emitting device layer 130. The protective layer 125 may make the fingerprint recognition sensor 120 and the light emitting device layer 130 insulated from each other. This prevents the light emitting device layer 130 from affecting the fingerprint recognition sensor 120. Specifically, in the embodiment shown in FIG. 2, the protective layer 125 is provided between the light emitting device layer 130 and the second electrode 124. In the embodiment shown in FIG. 4, the protective layer 125 is provided between the light emitting device layer 130 and the first electrode 121.

Optionally, the material of the protective layer 125 may be selected from one or a combination of silicon oxide, silicon nitride, and silicon oxynitride. Of course, according to actual selection and specific requirements, the material of the protective layer 125 can also be other insulating materials, which is not uniquely limited here.

Specifically, as shown in FIG. 2 to FIG. 5, the protective layer 125 is provided with a first contact hole 1251. The first contact hole 1251 is located between two adjacent first electrodes 121. The first contact hole 1251 penetrates the piezoelectric layer 123 and the second electrode 124. The light emitting device layer 130 (the fifth electrode 131) is electrically connected to the second driving circuit D2 (the second drain electrode 1194) through the first contact hole 1251. In this embodiment, the piezoelectric layer 123 is provided with a first escape opening 1231 for avoiding the first contact hole 1251. The second electrode 124 is provided with a second escape opening 1241 for avoiding the first contact hole 1251. The protective layer 125 covers the inner walls of the first escape opening 1231 and the second escape opening 1241.

Optionally, the material of the first electrode 121 is a conductive material. In the embodiment of the present application, the material of the first electrode 121 is indium tin oxide (ITO). Of course, according to actual choices and specific requirements, the first electrode 121 can also be made of other conductive materials, such as transparent electrode materials such as indium zinc oxide (IZO), or may also be made of a metal electrode material such as aluminum (Al), silver (Argentum, Ag), or lithium (Li), which is not exclusively limited here.

Optionally, the material of the second electrode 124 is a conductive material. In the embodiment of the present application, the material of the second electrode 124 may be silver. Of course, according to actual choices and specific requirements, the first electrode 121 can also be made of other conductive materials, such as transparent electrode materials such as indium tin oxide and indium zinc oxide, or metal electrode materials such as aluminum, silver, or lithium, which is not exclusively limited here.

Optionally, the material of the piezoelectric layer 123 is a piezoelectric material. Piezoelectric material is a kind of functional material that can realize mutual conversion between mechanical signals and electrical signals. When a certain force is applied to the piezoelectric material, positive and negative charges will appear on the surface of the material in proportion to the magnitude of the applied force. This phenomenon is the positive piezoelectric effect of the material. When a certain voltage is applied to the piezoelectric material, the piezoelectric material will deform and vibrate. This phenomenon is the inverse piezoelectric effect of piezoelectric materials. In the embodiment of the present application, the material of the piezoelectric layer 123 is poly (vinylidene fluoride) (PVDF). Of course, the material of the piezoelectric layer 123 may also be other piezoelectric materials, such as aluminum nitride (AlN), zinc oxide (ZnO), and lead zirconate titanate piezoelectric ceramics (PZT) and other piezoelectric materials are not uniquely limited here.

Specifically, as shown in FIG. 2 and FIG. 4, the fingerprint recognition sensor 120 further includes an interlayer dielectric layer 122 provided between the first electrode 121 and the piezoelectric layer 123. The first contact hole 1251 penetrates the interlayer dielectric layer 122. The interlayer dielectric layer 122 may insulate the first electrode 121 and the piezoelectric layer 123. This prevents the piezoelectric layer 123 from affecting the induced charges of the first electrode 121, and effectively improves the accuracy of fingerprint recognition.

Optionally, the material of the interlayer dielectric layer 122 may be selected from one or a combination of silicon oxide, silicon nitride, and silicon oxynitride. Of course, according to actual choices and specific requirements, the material of the interlayer dielectric layer 122 can also be other insulating materials, which is not uniquely limited here.

Specifically, as shown in FIG. 2 and FIG. 4, the first driving circuit D1 includes a first thin film transistor T1 electrically connected to the first electrode 121. The electrical signal generated by the first electrode 121 can be transmitted to the driving circuit layer 110 through the first thin film transistor T1.

Specifically, as shown in FIG. 2 and FIG. 4, the second driving circuit D2 further includes a second thin film transistor T2 electrically connected to the light emitting device layer 130. The light emitting device layer 130 can be controlled to emit light through the second thin film transistor T2. The light emitting device 130 layer is electrically connected to the second thin film transistor T2 through the first contact hole 1251.

Specifically, as shown in FIG. 2 and FIG. 4, the first thin film transistor T1 and the second thin film transistor T2 are arranged in the same layer. In the embodiment of the present application, by arranging the first thin film transistor T1 and the second thin film transistor T2 in the same layer, the thickness of the driving circuit layer 110 (the display panel 100) can be reduced. In addition, the manufacturing process of the driving circuit layer 110 can be simplified, and the manufacturing efficiency of the driving circuit layer 110 can be effectively improved.

Specifically, as shown in FIG. 2 and FIG. 4, the first thin film transistor T1 includes a first semiconductor layer 1131, a first source 1191 in contact with one end of the first semiconductor layer 1131, a first drain 1192 in contact with the other end of the first semiconductor layer 1131, and a first gate 1151 spaced apart on one side of the first semiconductor layer 1131. The first electrode 121 is connected to the first drain 1192.

The second thin film transistor T2 includes a second semiconductor layer 1132, a second source 1193 in contact with one end of the second semiconductor layer 1132, a second drain 1194 in contact with the other end of the second semiconductor layer 1132, and a second gate 1152 spaced apart on one side of the second semiconductor layer 1132. The second drain 1194 is electrically connected to the light emitting device layer 130.

The first semiconductor layer 1131 and the second semiconductor layer 1132 are arranged in the same layer. The first source 1191, the first drain 1192, the second source 1193, and the second drain 1194 are arranged in the same layer. The first gate 1151 and the second gate 1152 are arranged in the same layer, so that the first thin film transistor T1 and the second thin film transistor T2 are arranged in the same layer.

Specifically, as shown in FIG. 2 and FIG. 4, the driving circuit layer 110 further includes a substrate 111, a buffer layer 112, a first insulating layer 114, a second insulating layer 116, and a planarization layer 1195. The first semiconductor layer 1131 and the second semiconductor layer 1132 are provided on the buffer layer 112 at intervals. The first insulating layer 114 covers the first semiconductor layer 1131, the second semiconductor layer 1132 and the buffer layer 112. The first gate 1151 and the second gate 1152 are disposed on the first insulating layer 114 at intervals. The first gate 1151 is located above the first semiconductor layer 1131. The second gate 1152 is located above the second semiconductor layer 1132. The second insulating layer 116 covers the first gate 1151, the second gate 1152 and the first insulating layer 114. The first source 1191, the first drain 1192, the second source 1193, and the second drain 1194 are spaced apart on the second insulating layer 116, and the first source 1191 and the first drain 1192 are located in the first semiconductor layer 1131 above. The second source electrode 1193 and the second drain electrode 1194 are located above the second semiconductor layer 1132. The planarization layer 1195 covers the first source 1191, the first drain 1192, the second source 1193, and the second drain 1194. In this embodiment, the first thin film transistor T1 and the second thin film transistor T2 are top-gate thin film transistors. Of course, according to actual choices and specific requirements, the first thin film transistor T1 and the second thin film transistor T2 may also be bottom-gate thin film transistors, which are not uniquely limited here.

Specifically, as shown in FIG. 2 and FIG. 4, the driving circuit layer 110 further includes a third electrode 1171, a fourth electrode 1172 and an interlayer insulating layer 118. The third electrode 1171 and the fourth electrode 1172 are arranged between the second insulating layer 116 and the planarization layer 1195, and the third electrode 1171 and the fourth electrode 1172 are arranged at intervals. The third electrode 1171 is located above the first gate 1151, and the third electrode 1171 and the first gate 1151 form a first storage capacitor. The fourth electrode 1172 is located above the second gate 1152, and the fourth electrode 1172 and the second gate 1152 form a second storage capacitor. The interlayer insulating layer 118 covers the third electrode 1171, the fourth electrode 1172 and the second insulating layer 116. The first source 1191, the first drain 1192, the second source 1193, and the second drain 1194 are arranged on the interlayer insulating layer 118 at intervals. The planarization layer 1195 covers the first source electrode 1191, the first drain electrode 1192, the second source electrode 1193, the second drain electrode 1194 and the interlayer insulating layer 118.

Specifically, as shown in FIG. 2 and FIG. 4, the light emitting device layer 130 includes a fifth electrode 131, an organic light emitting layer 133 provided on the fifth electrode 131, and a sixth electrode 134 provided on the organic light emitting layer 133. The fifth electrode 131 is connected to the second drain 1194. The organic light emitting layer 133 can be controlled to emit light by the second thin film transistor T2. In this embodiment, the fifth electrode 131 is provided on the protective layer 125.

Optionally, the fifth electrode 131 may be an anode, and the sixth electrode 134 may be a cathode. Of course, according to actual selection and specific requirements, the fifth electrode 131 may also be a cathode, and the sixth electrode 134 may be an anode, which is not uniquely limited here.

Specifically, as shown in FIG. 2 and FIG. 4, the light emitting device layer 130 further includes a pixel definition layer 132. The pixel definition layer 132 covers the fifth electrode 131 and the protective layer 125. The pixel definition layer 132 encloses a plurality of openings 1321. The openings 1321 expose the fifth electrode 131. The organic light emitting layer 133 is disposed in the openings 1321. The sixth electrode 134 covers the organic light emitting layer 133 in the openings 1321.

Specifically, as shown in FIG. 2 and FIG. 4, the light emitting device layer 130 further includes an encapsulation layer 135. The encapsulation layer 135 covers the pixel definition layer 132 and the sixth electrode 134, thereby protecting the light emitting device layer 130 from moisture.

Specifically, as shown in FIG. 2 and FIG. 4, the display panel 100 further includes a touch layer 140 provided on the side of the light emitting device layer 130 away from the fingerprint recognition sensor 120, and the touch function can be realized through the touch layer 140.

The fingerprint recognition sensor 120 is integrated in the surface of the display panel 100 of the embodiment of the present application. The fingerprint recognition sensor 120 is used to transmit and receive ultrasonic waves. The user's fingerprint can be dynamically monitored by sending and receiving ultrasonic waves through the fingerprint recognition sensor 120. Of course, other functions can also be realized by the fingerprint recognition sensor 120 sending and receiving ultrasonic waves. For example, sending and receiving ultrasonic waves through the fingerprint recognition sensor 120 can dynamically monitor the user's blood oxygen concentration, etc., and perform analysis to ensure more safety performance.

Specifically, as shown in FIG. 2 to FIG. 5, the interlayer dielectric layer 122 is provided with a second contact hole 1221, and the second contact hole 1221 is provided corresponding to the first contact hole 1251. The light emitting device layer 130 (the fifth electrode 131) is connected to the driving circuit layer 110 (the second drain electrode 1194) through the first contact hole 1251 and the second contact hole 1221.

Specifically, as shown in FIG. 2 to FIG. 5, the planarization layer 1195 is provided with a third contact hole 1196 for exposing the second drain electrode 1194. The third contact hole 1196 is provided corresponding to the first contact hole 1251 and the second contact hole 1221. The light emitting device layer 130 (the fifth electrode 131) is connected to the driving circuit layer 110 (the second drain electrode 1194) through the first contact hole 1251, the second contact hole 1221, and the third contact hole 1196. In the embodiment shown in FIG. 2 and FIG. 3, the protective layer 125 may not cover the inner wall of the second contact hole 1221. However, the protective layer 125 needs to cover the surface of the interlayer dielectric layer 122 on the side close to the piezoelectric layer 123 around the second contact hole 1221. Of course, in order to improve the insulation effect, the protective layer 125 may also cover the inner wall of the second contact hole 1221. In the embodiment shown in FIG. 4 and FIG. 5, the protective layer 125 also covers the inner wall of the second contact hole 1221. The protective layer 125 may not cover the inner wall of the third contact hole 1196. However, the protective layer 125 needs to cover the surface of the planarization layer 1195 on the side close to the piezoelectric layer 123 around the third contact hole 1196. Of course, the protective layer 125 may also cover the inner wall of the third contact hole 1196.

Figure 6:
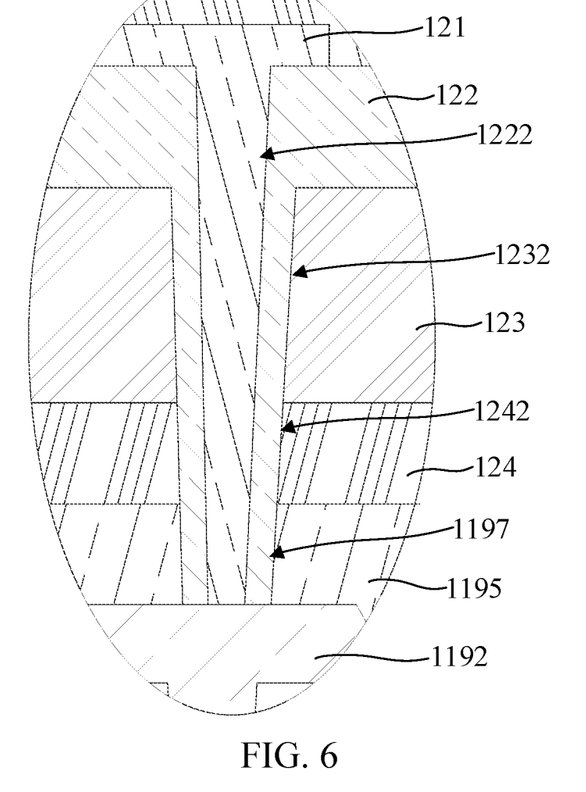
FIG. 6 is a schematic diagram 2 of a partial enlarged cross-sectional view of a second type of display panel provided by an embodiment of the present application.

Specifically, as shown in FIG. 2, FIG. 4 and FIG. 6, the planarization layer 1195 is provided with a fourth contact hole 1197 for exposing the first drain 1192. The fingerprint recognition sensor 120 (the first electrode 121) is connected to the driving circuit layer 110 (the first thin film transistor T1, the first drain 1192) through the fourth contact hole 1197.

Specifically, as shown in FIG. 4 and FIG. 6, the interlayer dielectric layer 122 is provided with a fifth contact hole 1222 corresponding to the fourth contact hole 1197. The fifth contact hole 1222 penetrates the piezoelectric layer 123 and the second electrode 124. The fingerprint recognition sensor 120 (the first electrode 121) is connected to the driving circuit layer 110 (the first thin film transistor T1, the first drain electrode 1192) through the fourth contact hole 1197 and the fifth contact hole 1222. In this embodiment, the piezoelectric layer 123 is provided with a third escape opening 1232 for avoiding the fifth contact hole 1222. The second electrode 124 is provided with a fourth escape opening 1242 for avoiding the fifth contact hole 1222. The interlayer dielectric layer 122 covers the inner walls of the third escape opening 1232, the fourth escape opening 1242 and the fourth contact hole 1197.

Figure 7:
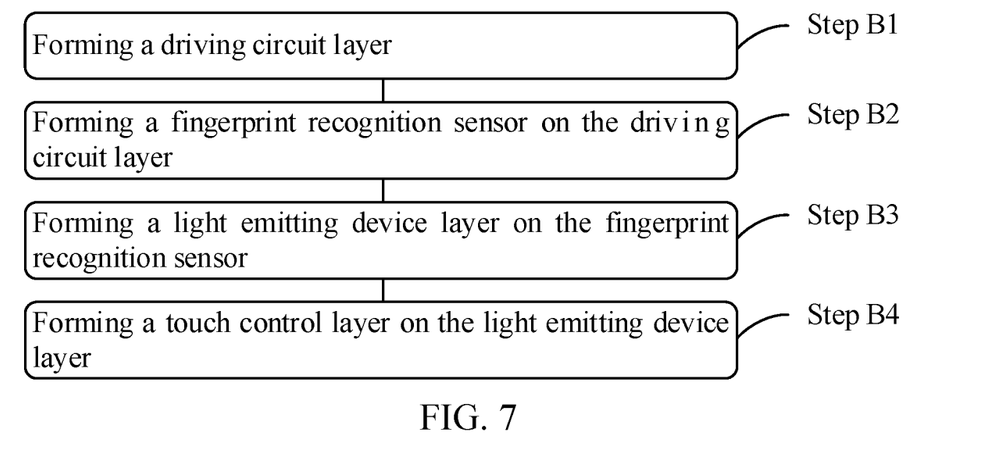
FIG. 7 is a schematic flowchart of a manufacturing method of a display panel provided by an embodiment of the present application.

Refer to FIG. 7, in conjunction with FIG. 1 to FIG. 4, an embodiment of the present application further provides a manufacturing method of the display panel 100, which includes the following steps:

Step B1, forming a driving circuit layer 110.

Step B2, a fingerprint recognition sensor 120 is formed on the driving circuit layer 110. The fingerprint recognition sensor 120 is electrically connected to the driving circuit layer 110. The fingerprint recognition sensor 120 is used to send and receive ultrasonic waves and convert the received ultrasonic waves into electrical signals for output.

Step B3, forming a light emitting device layer 130 on the fingerprint recognition sensor 120, and the light emitting device layer 130 is electrically connected to the driving circuit layer 110.

Specifically, in the above step B1, the step of forming the driving circuit layer 110 includes:

Step B11, forming a first thin film transistor T1 and a second thin film transistor T2.

In the subsequent step B2, the fingerprint recognition sensor 120 is electrically connected to the first thin film transistor T1. In the subsequent step B3, the light emitting device is electrically connected to the second thin film transistor T2. In this embodiment, the first thin film transistor T1 and the second thin film transistor T2 may be arranged in the same layer.

Specifically, in the above step B11, the step of forming the first thin film transistor T1 and the second thin film transistor T2 includes:

Step B111, forming a buffer layer 112 on the substrate 111.

Step B112, forming a first semiconductor layer 1131 and a second semiconductor layer 1132 on the buffer layer 112.

Step B113, forming a first insulating layer 114 on the first semiconductor layer 1131, the second semiconductor layer 1132 and the buffer layer 112.

Step B114, forming a first gate 1151 and a second gate 1152 on the first insulating layer 114.

Step B115, forming a second insulating layer 116 on the first gate 1151, the second gate 1152, and the second insulating layer 116.

Step B116, forming a third electrode 1171 and a fourth electrode 1172 on the second insulating layer 116.

Step B117, forming an interlayer insulating layer 118 on the third electrode 1171, the fourth electrode 1172, and the second insulating layer 116.

Step B118, forming a first source 1191, a first drain 1192, a second source 1193, and a second drain 1194 on the interlayer insulating layer 118.

Step B119, forming a planarization layer 1195 on the first source 1191, the first drain 1192, the second source 1193, the second drain 1194 and the interlayer insulating layer 118.

Specifically, in the above step B2, as shown in FIG. 2, the step of forming the fingerprint recognition sensor 120 on the driving circuit layer 110 includes:

Step B21, forming a first electrode 121 on the driving circuit layer 110, the first electrode 121 is specifically formed on the planarization layer 1195, and the first electrode 121 is electrically connected to the first thin film transistor T1.

Step B22, forming a piezoelectric layer 123 on one side of the first electrode 121. Specifically, first forming an interlayer insulating layer 118 on the first electrode 121 and the planarization layer 1195. Then forming a pressure on the interlayer insulating layer 118 Electric layer 123.

Step B23, forming a second electrode 124 on the side of the piezoelectric layer 123 away from the first electrode 121.

Specifically, in the above step B2, as shown in FIG. 4, the step of forming the fingerprint recognition sensor 120 on the driving circuit layer 110 includes:

Step B24, forming a second electrode 124 on the driving circuit layer 110, wherein the second electrode 124 is specifically formed on the planarization layer 1195.

Step B25, forming a piezoelectric layer 123 on one side of the second electrode 124.

Step B26, forming a first electrode 121 on the side of the piezoelectric layer 123 away from the second electrode 124. Specifically, an interlayer dielectric layer 122 is first formed on the piezoelectric layer 123. Then an interlayer dielectric layer 122 is formed the first electrode 121. The first electrode 121 is electrically connected to the first thin film transistor T1.

Specifically, in the above step B23 or step B25, the manner of forming the piezoelectric layer 123 may be: first forming the piezoelectric material layer by coating. Then the piezoelectric material layer is annealed, so that the piezoelectric material layer obtains the desired crystal structure, and further, the stress can be eliminated. Then, the piezoelectric material layer is polarized so that the piezoelectric material layer has good piezoelectric performance. Finally, the piezoelectric material layer is patterned to obtain the piezoelectric layer 123.

Specifically, before forming the light emitting device layer 130, a step of forming a protective layer 125 on the fingerprint recognition sensor 120 is further included. As shown in FIG. 2, the protective layer 125 is specifically formed on the second electrode 124. As shown in FIG. 4, the protective layer 125 is specifically formed on the interlayer dielectric layer 122 and the first electrode 121.

In the above step B3, the step of forming the light emitting device layer 130 on the fingerprint recognition sensor 120 includes:

Step B31, forming a fifth electrode 131 on the fingerprint recognition sensor 120, specifically, forming a fifth electrode 131 on the protective layer 125.

Step B32, forming a pixel defining layer 132 on the fifth electrode 131, specifically, forming a pixel defining layer 132 on the fifth electrode 131 and the protective layer 125.

Step B33, forming an organic light emitting layer 133 in the opening 1321 of the pixel defining layer 132.

Step B34, forming a sixth electrode 134 on the organic light emitting layer 133.

Step B35, forming an encapsulation layer 135 on the pixel defining layer 132 and the sixth electrode 134.

Specifically, the manufacturing method of the display panel 100 further includes the following steps:

Step B4, forming a touch layer 140 on the light emitting device layer 130, wherein the touch layer 140 is specifically disposed on the encapsulation layer 135.

Figure 8:
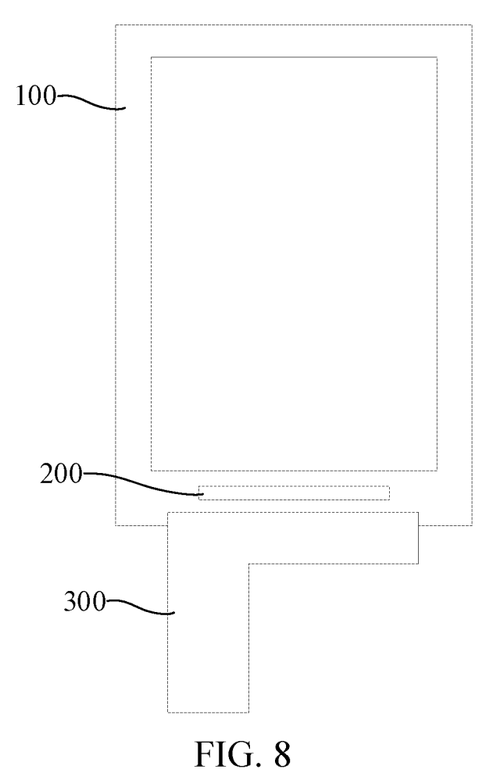
FIG. 8 is a schematic structural diagram of a mobile terminal provided by an embodiment of the present application.

Refer to FIG. 8, an embodiment of the present application also provides a mobile terminal including the above-mentioned display panel 100, an integrated circuit chip 200 electrically connected to the display panel 100, and a control board (not shown) electrically connected to the other end of the flexible circuit board 300. The mobile terminal in the embodiment of the present application may be a mobile phone, a tablet computer, and the like. The mobile terminal of the embodiment of the present application includes all the above technical solutions. Therefore, the mobile terminal of the embodiment of the present application has the beneficial effects of all the above technical solutions, which will not be repeated here.

In the foregoing, the display panel and the mobile terminal provided by the embodiments of the present application have been introduced in detail. Specific examples are used in this article to illustrate the principle and implementation of this application. The description of the above embodiments is only used to help understand the method and core idea of the present application. In addition, for those skilled in the art, based on the idea of the present application, there will be changes in the specific implementation and the scope of application. In summary, the content of this specification should not be construed as a limitation to this application.

What is claimed is:

1. A display panel, comprising:
    a driving circuit layer comprising a first driving circuit and a second driving circuit;
    a fingerprint recognition sensor disposed on a side of the driving circuit layer, wherein the fingerprint recognition sensor is electrically connected to the first driving circuit, the fingerprint recognition sensor comprises a piezoelectric layer, a plurality of first electrodes disposed on a side of the piezoelectric layer, and a second electrode disposed on another side of the piezoelectric layer, the first electrodes are electrically connected to the first driving circuit, and the first electrodes are disposed at intervals;
    a protective layer disposed on a side of the fingerprint recognition sensor away from the driving circuit layer, wherein the protective layer is provided with a first contact hole, the first contact hole is located between two adjacent first electrodes, and the first contact hole penetrates the piezoelectric layer and the second electrode; and
    a light emitting device layer disposed on a side of the fingerprint recognition sensor away from the driving circuit layer, and the light emitting device layer is electrically connected to the second driving circuit through the first contact hole.

2. The display panel according to claim 1, wherein the piezoelectric layer is provided with a first escape opening for avoiding the first contact hole, the second electrode is provided with a second escape opening for avoiding the first contact hole, and the protective layer covers inner walls of the first escape opening and the second escape opening.

3. The display panel according to claim 1, wherein the first electrode is disposed on a side of the piezoelectric layer close to the driving circuit layer.

4. The display panel according to claim 1, wherein the second electrode is disposed on a side of the piezoelectric layer close to the driving circuit layer.

5. The display panel according to claim 1, wherein the fingerprint recognition sensor further comprises an interlayer dielectric layer disposed between the first electrode and the piezoelectric layer, and the first contact hole penetrates the interlayer dielectric layer.

6. The display panel according to claim 5, wherein the first driving circuit comprises a first thin film transistor electrically connected to the first electrode.

7. The display panel according to claim 6, wherein the second driving circuit comprises a second thin film transistor electrically connected to the light emitting device layer, and the light emitting device layer is electrically connected to the second thin film transistor through the first contact hole.

8. The display panel according to claim 7, wherein the first thin film transistor comprises a first semiconductor layer, a first source in contact with an end of the first semiconductor layer, a first drain in contact with another end of the first semiconductor layer, and a first gate spaced on a side of the first semiconductor layer, and the first electrode is connected to the first drain;
    the second thin film transistor comprises a second semiconductor layer, a second source in contact with an end of the second semiconductor layer, a second drain in contact with another end of the second semiconductor layer, and a second gate spaced on a side of the second semiconductor layer, and the second drain is electrically connected to the light emitting device layer;
    wherein the first semiconductor layer and the second semiconductor layer are arranged in a same layer, the first source, the first drain, the second source and the second drain are arranged in a same layer, and the first gate and the second gate are arranged in a same layer.

9. The display panel according to claim 7, wherein the driving circuit layer further comprises a substrate, a buffer layer, a first insulating layer, a second insulating layer, and a planarization layer, the first semiconductor layer and the second semiconductor layer are disposed on the buffer layer at intervals, the first insulating layer covers the first semiconductor layer, the second semiconductor layer, and the buffer layer; the first gate and the second gate are arranged on the first insulating layer at intervals, the first gate is located above the first semiconductor layer, the second gate is located above the second semiconductor layer; the second insulating layer covers the first gate, the second gate, and the first insulating layer; the first source, the first drain, the second source, and the second drain are spaced apart on the second insulating layer, the first source and the first drain are located above the first semiconductor layer, the second source and the second drain are located above the second semiconductor layer; the planarization layer covers the first source, the first drain, the second source, and the second drain.

10. The display panel according to claim 9, wherein the driving circuit layer further comprises a third electrode, a fourth electrode, and an interlayer insulating layer, the third electrode and the fourth electrode are disposed between the second insulating layer and the planarization layer, the third electrode and the fourth electrode are spaced apart, the third electrode is located above the first gate, the third electrode and the first gate form a first storage capacitor; the fourth electrode is located above the second gate, the fourth electrode and the second gate form a second storage capacitor; the interlayer insulating layer covers the third electrode, the fourth electrode, and the second insulating layer; the first source, the first drain, the second source, and the second drain are arranged on the interlayer insulating layer at intervals; the planarization layer covers the first source, the first drain, the second source, the second drain, and the interlayer insulating layer.

11. The display panel according to claim 10, wherein the interlayer dielectric layer is provided with a second contact hole, the second contact hole is provided corresponding to the first contact hole, and the light emitting device layer is connected to the second drain through the first contact hole and the second contact hole.

12. The display panel according to claim 11, wherein the planarization layer is provided with a third contact hole for exposing the second drain, the third contact hole is provided corresponding to the first contact hole and the second contact hole, and the light emitting device layer is connected to the second drain through the first contact hole, the second contact hole, and the third contact hole.

13. The display panel according to claim 10, wherein the planarization layer is provided with a fourth contact hole for exposing the first drain, and the first electrode is connected to the first drain through the fourth contact hole.

14. The display panel according to claim 13, wherein the interlayer dielectric layer is provided with a fifth contact hole corresponding to the fourth contact hole, the fifth contact hole penetrates the piezoelectric layer and the second electrode, and the first electrode is connected to the first drain through the fourth contact hole and the fifth contact hole.

15. The display panel according to claim 14, wherein the piezoelectric layer is provided with a third escape opening for avoiding the fifth contact hole, the second electrode is provided with a fourth escape opening for avoiding the fifth contact hole, and the interlayer dielectric layer covers inner walls of the third escape opening, the fourth escape opening, and the fourth contact hole.

16. The display panel according to claim 1, wherein the light emitting device layer comprises a fifth electrode, an organic light emitting layer disposed on the fifth electrode, and a sixth electrode disposed on the organic light emitting layer, the fifth electrode is connected to the second drain, and the fifth electrode is disposed on the protective layer.

17. The display panel according to claim 16, wherein the light emitting device layer further comprises a pixel definition layer, the pixel definition layer covers the fifth electrode and the protective layer, the pixel definition layer encloses a plurality of openings, the openings expose the fifth electrode, the organic light emitting layer is disposed in the openings, and the sixth electrode covers the organic light emitting layer in the openings.

18. The display panel according to claim 17, wherein the light emitting device layer further comprises an encapsulation layer, and the encapsulation layer covers the pixel definition layer and the sixth electrode.

19. The display panel according to claim 1, wherein the display panel further comprises a touch layer disposed on a side of the light emitting device layer away from the fingerprint recognition sensor.

20. A mobile terminal, comprising:
the display panel according to claim 1;
an integrated circuit chip electrically connected to the display panel; and
a flexible circuit board, wherein an end of the flexible circuit board is electrically connected to the display panel.

* * * * *